(12) United States Patent
Chien

(10) Patent No.: US 10,388,678 B2
(45) Date of Patent: Aug. 20, 2019

(54) GATE STRUCTURE, METHOD FOR MANUFACTURING GATE STRUCTURE, AND DISPLAY DEVICE

(71) Applicants: HKC Corporation Limited, Shenzhen, Guangdong (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/578,435

(22) PCT Filed: Sep. 5, 2017

(86) PCT No.: PCT/CN2017/100441
§ 371 (c)(1),
(2) Date: Nov. 30, 2017

(87) PCT Pub. No.: WO2018/157573
PCT Pub. Date: Sep. 7, 2018

(65) Prior Publication Data
US 2018/0301475 A1    Oct. 18, 2018

(30) Foreign Application Priority Data

Mar. 3, 2017    (CN) .......................... 2017 1 0123214

(51) Int. Cl.
*H01L 27/12*    (2006.01)
*H01L 29/423*    (2006.01)
(Continued)

(52) U.S. Cl.
CPC .......... *H01L 27/1244* (2013.01); *H01L 21/28* (2013.01); *H01L 27/1214* (2013.01);
(Continued)

(58) Field of Classification Search
None
See application file for complete search history.

(56) References Cited

U.S. PATENT DOCUMENTS

2012/0132917 A1* 5/2012 Lee .................... H01L 27/1218
257/59

FOREIGN PATENT DOCUMENTS

CN    1489790 A    4/2004
CN    1652003 A    8/2005
(Continued)

OTHER PUBLICATIONS

International Search Report for PCT/CN2017/100441 dated Dec. 4, 2017; pp. 1-13.

*Primary Examiner* — Minh Loan Tran
(74) *Attorney, Agent, or Firm* — Muncy, Geissler, Olds & Lowe, P.C.

(57) ABSTRACT

A method for manufacturing a gate structure includes: forming a buffer layer on a lateral surface of a substrate; forming a groove on the buffer layer, where the groove penetrates the buffer layer; forming a gate in the groove, where an upper surface of the gate and an upper surface of the buffer layer are located on a same plane; forming an insulating layer on the upper surface of the gate and the upper surface of the buffer layer; forming, on an upper surface of the insulating layer, a semiconductor layer disposed opposite the gate; and forming, on an upper surface of the semiconductor layer and/or the upper surface of the insulating layer, a data line partially overlapping the semi-
(Continued)

conductor layer. A display device is further disclosed. The display device includes a gate structure.

13 Claims, 5 Drawing Sheets

(51) Int. Cl.
*H01L 27/146* (2006.01)
*H01L 29/417* (2006.01)
*H01L 27/148* (2006.01)
*H01L 21/28* (2006.01)
*G02F 1/1368* (2006.01)

(52) U.S. Cl.
CPC ...... *H01L 27/1218* (2013.01); *H01L 27/1237* (2013.01); *H01L 27/1251* (2013.01); *H01L 27/1262* (2013.01); *H01L 27/14614* (2013.01); *H01L 27/14812* (2013.01); *H01L 29/41733* (2013.01); *H01L 29/41775* (2013.01); *H01L 29/42384* (2013.01); *G02F 1/1368* (2013.01); *H01L 27/124* (2013.01); *H01L 2029/42388* (2013.01)

(56) References Cited

FOREIGN PATENT DOCUMENTS

| | | |
|---|---|---|
| CN | 1740882 A | 3/2006 |
| CN | 106876260 A | 6/2017 |
| JP | H03159174 A | 7/1991 |

* cited by examiner

2

GATE STRUCTURE, METHOD FOR MANUFACTURING GATE STRUCTURE, AND DISPLAY DEVICE

BACKGROUND

Technical Field

This application relates to the field of display technologies, and in particular, to a gate structure, a method for manufacturing a gate structure, and a display device.

Related Art

With the development of technologies, electronic products become increasingly popular, and in particular, computers and televisions become a part of people's daily life. A large quantity of electronic display devices are mounted on various types of electronic products, and are widely applied in various fields. Currently, thin-film-transistor liquid-crystal display (TFT-LCD) screens are increasingly widely used. A circuit layout used in a thin-film transistor (TFT) glass substrate of the TFT-LCD screen usually includes a gate (or referred to as a scan line or GATE) and a data line (or referred to as DATA). The gate may intersect with the data line. When an exception occurs in a process of forming a gate, and in particular, when a profile angle of the gate is excessively large, during subsequent formation of an insulating layer, coverage is low at a position where the profile angle of the gate is excessively large. Consequently, when film forming is subsequently performed on the data line, wire breakage is very likely to occur at an intersection between the gate and the data line. As a result, a signal transmitted in the data line is interrupted, and the product yield is severely affected.

SUMMARY

An objective of this application is to provide a gate structure, a method for manufacturing a gate structure, and a display device, to resolve a problem that in the related art, for a data line, a problem of wire breakage is very likely to occur at an intersection between a gate and the data line.

This application provides a method for manufacturing a gate structure, comprising the following steps:

providing a substrate, and forming a buffer layer on a lateral surface of the substrate;

forming a groove on the buffer layer, where the groove penetrates the buffer layer;

forming a gate in the groove, where an upper surface of the gate and an upper surface of the buffer layer are located on a same plane;

forming an insulating layer on the upper surface of the gate and the upper surface of the buffer layer;

forming, on an upper surface of the insulating layer, a semiconductor layer disposed opposite the gate; and forming, on an upper surface of the semiconductor layer and/or the upper surface of the insulating layer, a data line partially overlapping the semiconductor layer.

Optionally, the groove is formed by means of a photoetching process.

Further, steps of the photoetching comprise:

coating a photoresist on the upper surface of the buffer layer;

disposing a photomask and a light source over the photoresist;

turning on the light source, where the light source emits a light ray to pass through the photomask to expose a part of the photoresist;

developing the exposed photoresist;

corroding the exposed photoresist, and corroding the buffer layer located between the exposed photoresist and the substrate; and cleaning the substrate, and eliminating the photoresist and the buffer layer.

Further, the method for manufacturing a gate structure further comprises the following steps:

forming a conducting layer of the gate on upper surfaces of the photoresist and the groove by means of deposition; and stripping the photoresist.

Optionally, a method for stripping the photoresist is: corroding the photoresist by using a photoresist-removal liquid.

Optionally, the buffer layer, the insulating layer, and the semiconductor layer are formed by means of a chemical vapor deposition process.

Optionally, materials used in the buffer layer and the insulating layer comprise silicon nitride.

Optionally, materials used in the gate and the data line comprise aluminum or molybdenum.

This application further provides a gate structure, comprising:

a substrate;

a buffer layer, formed on a lateral surface of the substrate, where a groove penetrating the buffer layer is disposed on the buffer layer;

a gate, formed in the groove, where an upper surface of the buffer layer and an upper surface of the gate are located on a same plane;

an insulating layer, formed on the upper surface of the buffer layer and the upper surface of the gate;

a semiconductor layer, formed on an upper surface of the insulating layer and disposed opposite the gate; and a data line, formed on the upper surface of the insulating layer and/or an upper surface of the semiconductor layer, and partially overlapping the semiconductor layer.

Optionally, the groove is formed by means of a photoetching process.

Optionally, a conducting layer of the gate is formed on upper surfaces of a photoresist and the groove by means of deposition.

Optionally, the buffer layer, the insulating layer, and the semiconductor layer are formed by means of a chemical vapor deposition process.

Optionally, materials used in the buffer layer and the insulating layer comprise silicon nitride.

Optionally, materials used in the gate and the data line comprise aluminum or molybdenum.

This application further provides another gate structure, comprising:

a substrate;

a buffer layer, formed on a lateral surface of the substrate, where a groove penetrating the buffer layer is disposed on the buffer layer;

a gate, formed in the groove, where an upper surface of the buffer layer and an upper surface of the gate are located on a same plane;

an insulating layer, formed on the upper surface of the buffer layer and the upper surface of the gate;

a semiconductor layer, formed on an upper surface of the insulating layer and disposed opposite the gate; and a data line, formed on the upper surface of the insulating layer and/or an upper surface of the semiconductor layer, and partially overlapping the semiconductor layer, where the groove is formed by means of a photoetching process; a conducting layer of the gate is formed by means of deposition on upper surfaces of a photoresist and the groove; and the buffer layer, the insulating layer, and the semiconductor layer are formed by means of a chemical vapor deposition process.

Based on the foregoing technical solutions, for the gate structure, the method for manufacturing a gate structure, and the display device provided in this application, a buffer layer is formed on a substrate; a groove is formed on the buffer layer; a gate is formed in the groove, where an upper surface of the gate and an upper surface of the buffer layer are on a same plane; an insulating layer is then formed on the upper surface of the gate and the upper surface of the buffer layer; and a semiconductor layer and a data line are then formed on the insulating layer. In this way, the insulating layer is formed on one plane, and is no longer affected by a profile angle of the gate, thereby greatly reducing a probability of wire breakage at an intersection between the data line and the gate, and improving the product yield.

DETAILED DESCRIPTION

To make the objectives, technical solutions, and advantages of this application clearer, the following further describes this application in detail with reference to the accompanying drawings and the embodiments. It should be understood that the specific embodiments described herein are merely for explaining this application, and are not intended to limit this application.

It should be noted that when a component is described to be "fixed on" or "disposed on" another component, the component may be directly on the another component, or there may be an intermediate component. When a component is described to be "connected to" another component, the component may be directly connected to the another component, or there may be an intermediate component.

In addition, it should further be understood that direction terms such as left, right, up, and down in the embodiments of this application are merely relative concepts or with reference to normal use states of a product, and shall not be considered as being limitative. The following describes in detail implementation of this application with reference to specific embodiments.

Figure 1:
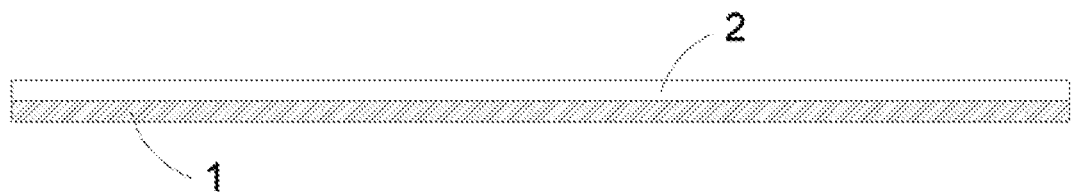
FIG. 1 is a schematic diagram of a buffer layer according to an embodiment of this application.
Figure 2:
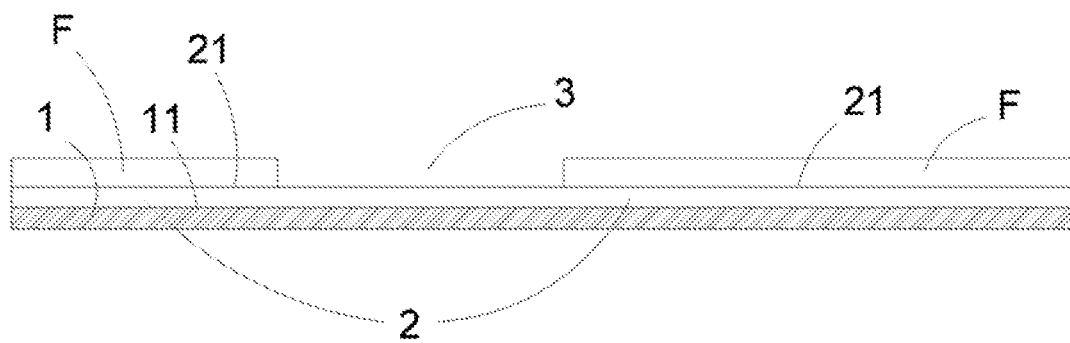
FIG. 2 is a schematic diagram of coating a photoresist according to an embodiment of this application.
Figure 3:
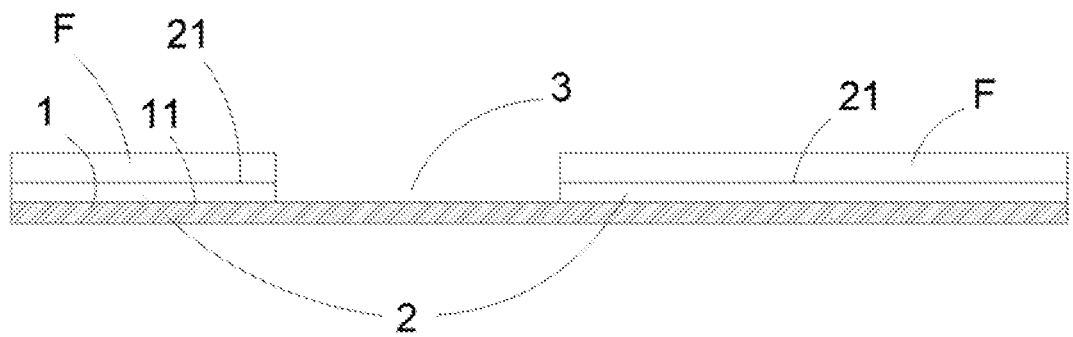
FIG. 3 is a schematic diagram of photoetching according to an embodiment of this application.
Figure 4:
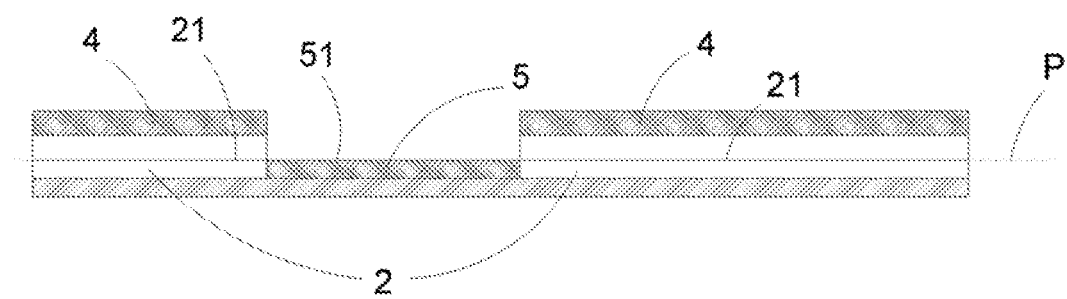
FIG. 4 is a schematic diagram of forming a gate according to an embodiment of this application.
Figure 5:
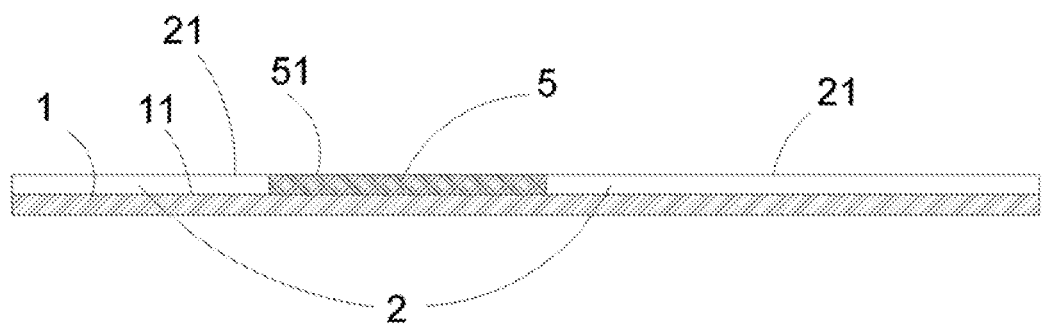
FIG. 5 is a schematic diagram of removing a photoresist according to an embodiment of this application.
Figure 6:
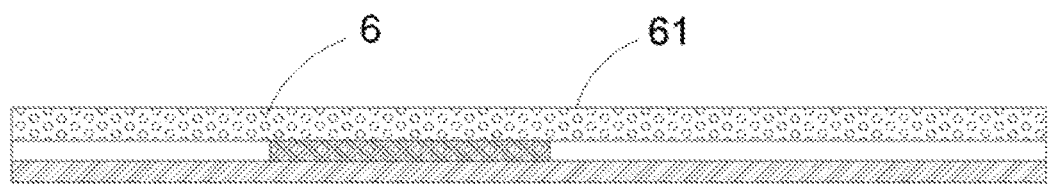
FIG. 6 is a schematic diagram of forming an insulating layer according to an embodiment of this application.
Figure 7:
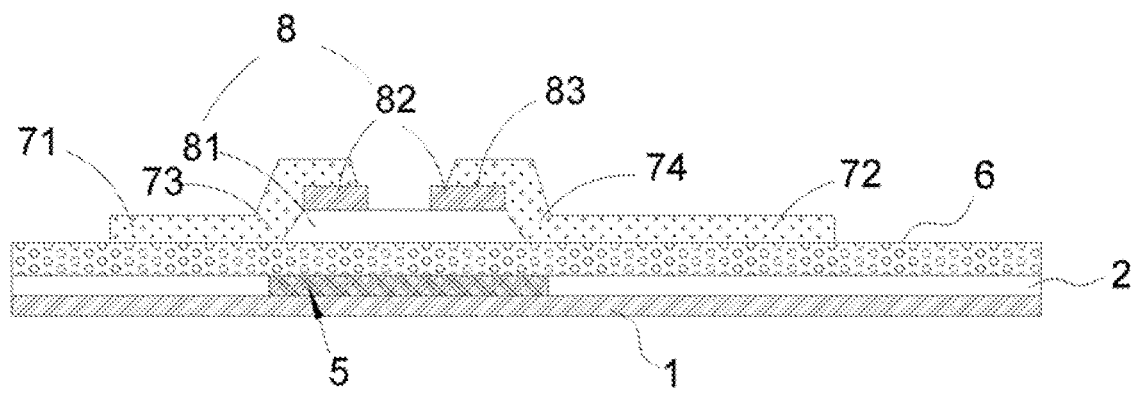
FIG. 7 is a schematic diagram of a gate structure according to an embodiment of this application.
Figure 8:
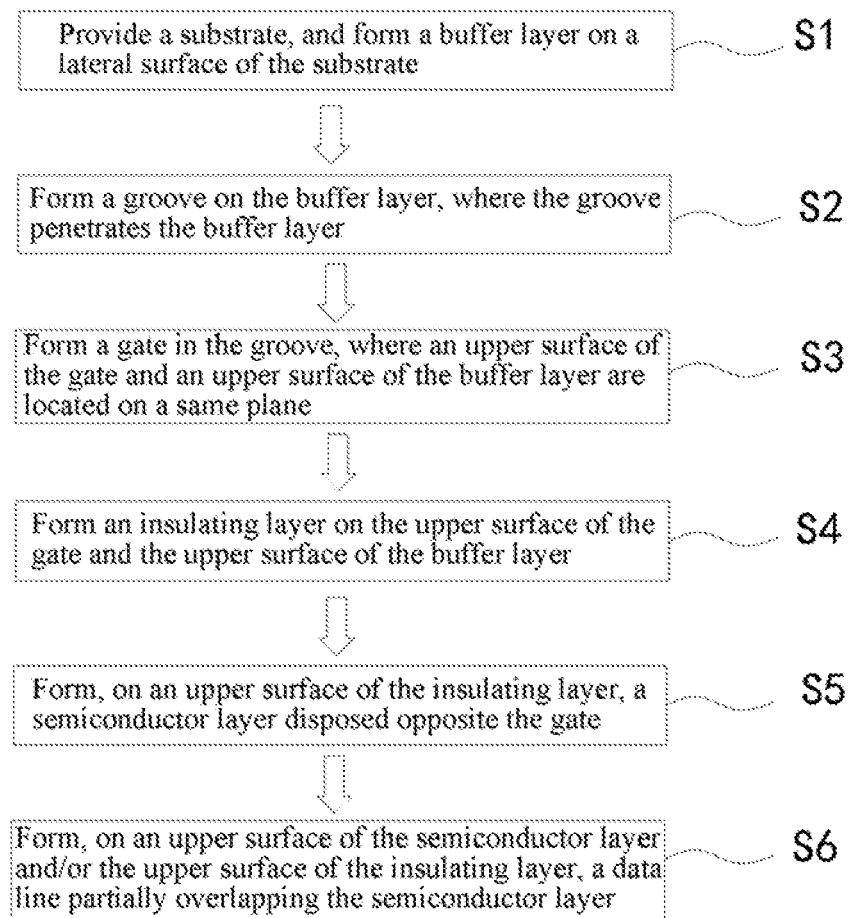
FIG. 8 is a manufacturing flowchart of an embodiment of a method for manufacturing a gate structure of this application.
Figure 9:
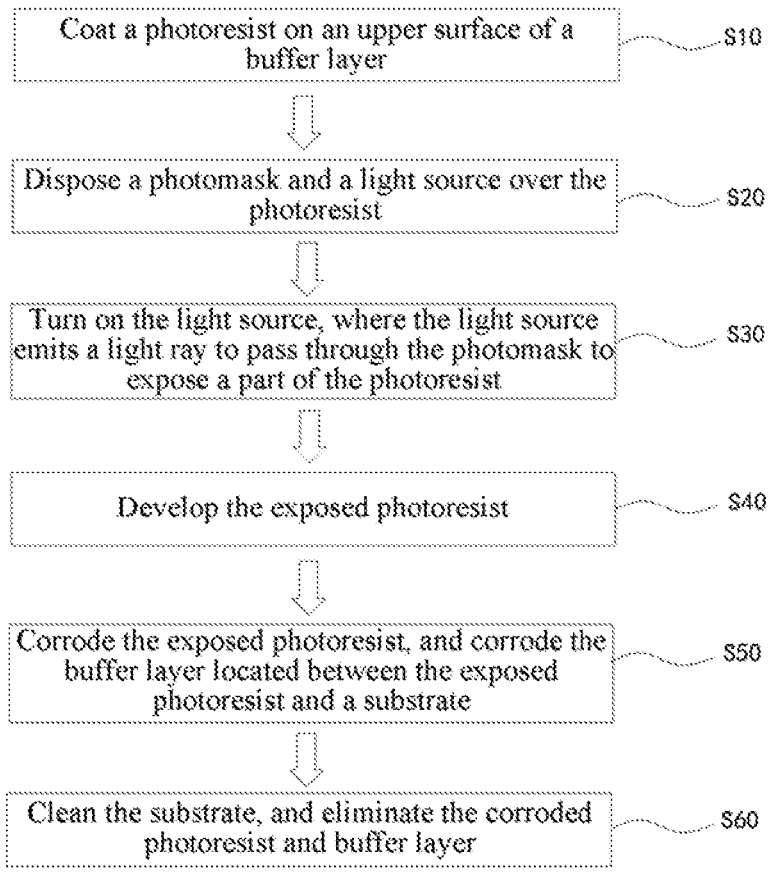
FIG. 9 is a manufacturing flowchart of an embodiment of a photoetching method of this application.
Figure 10:
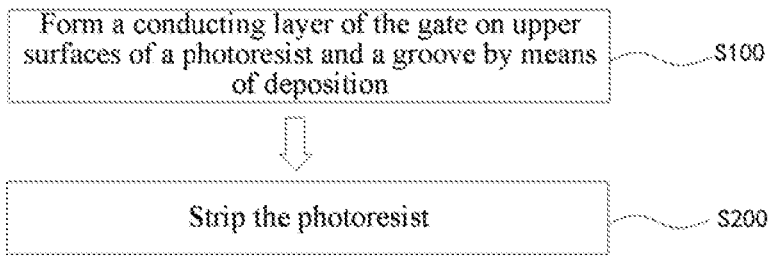
FIG. 10 is a manufacturing flowchart of an embodiment of a method for forming a gate of this application.

As shown in FIG. 1 and FIG. 10, this application provides a gate structure and a method for manufacturing a gate structure. The method for manufacturing a gate is: Step S1: Prepare a substrate 1, and form a buffer layer 2 on same lateral surface 11 of the substrate 1. Step S2: Form a groove 3 on an upper surface 21 of the buffer layer, where the groove 3 penetrates the buffer layer 2. Step S3: Form a gate 5 in the groove 3, where an upper surface 51 of the gate and the upper surface 21 of the buffer layer are on a same plane P. Step S4: Form an insulating layer 6 on the upper surface 51 of the gate and the upper surface 21 of the buffer layer. Step S5: Form, on an upper surface 61 of the insulating layer 6, a semiconductor layer 8, disposed opposite the gate 5. Step S6: Form, on the semiconductor layer 8 and/or the insulating layer 6, a data line 71 intersecting with the gate 5.

Because the upper surface 51 of the gate and the upper surface 21 of the buffer layer are on the same plane P and the insulating layer 6 may be formed on the plane P, the impact on coverage of the insulating layer 6 at an end of the gate 5 by the height, shape, or profile angle of the gate 5 is eliminated, conditions of wire breakage at an intersection between the gate 5 and the data line 71 when film forming is performed on the data line 71 are greatly reduced, and the product yield is improved.

In an embodiment of this application, the buffer layer 2 is formed on a lateral surface of the substrate 1. In another embodiment, the buffer layer 2 may further be located on two lateral sides or at another position of the substrate 1. This is not uniquely limited herein.

In an embodiment of this application, a method used for manufacturing the gate 5 and the buffer layer 2 around the gate 5 is: first, forming the buffer layer 2; next, forming the groove 3 on the buffer layer 2, where the groove 3 penetrates the buffer layer 2; and forming the gate 5 in the groove 3. In another embodiment, another sequence may be used. For example, the gate 5 may be formed first, and next, the buffer layer 2 is formed on the same lateral surface 11 around the gate 5. Alternatively, the buffer layer 2 and the gate 5 are separately and directly formed in different areas on the substrate 1. This is not uniquely limited herein.

In an embodiment of this application, the upper surface 51 of the gate and the upper surface 21 of the buffer layer are on a same plane P. In this way, the insulating layer 6 can be formed on the plane P, so that the semiconductor layer 8 and the data line 71 may be directly formed on one plane, and the impact on the data line 71 by a shape or a profile angle of the gate 5 is reduced. In another embodiment, the upper surface 51 of the gate and the upper surface 21 of the buffer layer are not necessarily on a same plane P, and there may be a relative height difference. For example, a distance between the upper surface 51 of the gate 5 and the substrate 1 is less than a distance between the upper surface 21 of the buffer layer and the substrate 1, a "U" shape is formed, and the semiconductor layer 8 is formed in a concave portion (not shown) of the "U" shape. If a distance between an upper surface 83 of the semiconductor layer and the substrate 1 is the same as a distance between the upper surface 61 of the insulating layer on the buffer layer 2 and the substrate 1, the upper surface 83 of the semiconductor layer and the upper surface 61 of the insulating layer on the buffer layer 2 are on a same plane. In this way, the data line 71 is formed on a plane, and conditions of wire breakage at an intersection between the data line 71 and the gate 5 are also reduced.

Similarly, the distance between the upper surface 51 of the gate 5 and the substrate 1 is greater than the distance between the upper surface 21 of the buffer layer and the substrate 1, an "∩" shape is formed, and the semiconductor layer 8 is formed in a convex portion of the "∩" shape. This is not uniquely limited herein.

In an embodiment of this application, the insulating layer 6 is formed on the upper surface 51 of the gate and the upper surface 21 of the buffer layer, so that the insulating layer 6 achieves an insulating effect and is used as substrates of the semiconductor layer 8 and the data line 71. In another embodiment, the insulating layer 6 may further be deposited on only the upper surface 51 of the gate, and the buffer layer 2 is used to achieve an insulating effect on an area other than the gate. Certainly, insulation may be achieved in another manner, provided that insulation between the gate 5 and the semiconductor layer 8 can be achieved. This is not uniquely limited herein.

In an embodiment of this application, the semiconductor layer 8 includes a first semiconductor layer 81 and a second semiconductor layer 82. A material deposited in the first semiconductor layer 81 is amorphous silicon, and a material deposited in the second semiconductor layer 82 is N-type amorphous silicon with high doping concentration. In addition, the semiconductor layer 8 partially overlaps the gate 5. In this way, the gate can control current conduction between the data line 71 and a source 72 in the semiconductor layer. Certainly, in another embodiment, the semiconductor layer may be formed by using another material, provided that a switch function of the gate 5 can be achieved. This is not uniquely limited herein.

In an embodiment of this application, the data line 71 and the source 72 are formed on the upper surface 61 of the insulating layer 6 or the upper surface 83 of the semiconductor layer 8, and intersect with the gate 5. An intersection area between the data line 71 and the gate 5 and between the source 72 and the gate 5 is a position at which the gate 5 controls the current between the data line 71 and the source 72.

Further, in an embodiment of this application, the groove 3 is formed by using a photoetching method. In this way, the groove 3 used in the gate 5 may be generated on the buffer layer 2 by means of photoetching. It is very easy to implement photoetching, and costs are low. Certainly, in another embodiment, another method, for example, laser marking, may further be used, and in the another method, the groove 3 can be formed on the buffer layer 2. This is not uniquely limited herein. The photoetching method may further be applied to a process of generating the data line 71. The step of forming a data line 71 includes: First step: Form a conducting layer of the data line 71. Second step: Remove a conducting layer other than the data line 71 and the source 72 by using the photoetching method. Similarly, the method is not limited to photoetching provided that the data line 71 can be formed. This is not uniquely limited herein.

Further, in an embodiment of this application, steps of the photoetching includes: Step S10: Coat a photoresist F on the upper surface 21 of the buffer layer 2. Step S20: Dispose a photomask (not shown) and a light source (not shown) over the photoresist F. Step S30: Turn on the light source, where the light source emits a light ray to pass through the photomask to expose a part of the photoresist F. Step S40: Develop the exposed photoresist F. Step S50: Corrode the exposed and developed part of the photoresist F, and corrode the buffer layer 2 located between the exposed photoresist F and the substrate 1. Step S60: Clean the substrate 1, and eliminate the corroded photoresist F and the corroded the buffer layer 2. The photoresist F is evenly coated on the buffer layer 2. The photomask is disposed over the photoresist F. By performing development and corrosion, the buffer layer 2 at the groove 3 is corroded. Finally, the substrate 1 is cleaned, and therefore the groove 3 is formed.

Optionally, an exposed area of the photoresist F may be corroded, and an unexposed area of the photoresist F cannot be corroded. In another embodiment, a photoresist of another type may further be selected. For example, the unexposed area of photoresist F may be corroded. In addition, the steps in the photoetching method may be reduced or some other steps may be added, provided that the groove 3 can be formed on the buffer layer 2. This is not uniquely limited herein.

Further, in an embodiment of this application, steps of forming the gate 5 include the following steps. Step S100: Form the gate 5 and the conducting layer 4 on upper surfaces of the photoresist F and the groove 3. Step S200: Strip the photoresist F. The conducting layer 4 is formed on the upper surfaces of the photoresist F and the groove 3, and the groove 3 is filled with the conducting layer that is used as the gate 5. When the photoresist F is stripped, the conducting layer 4 on the photoresist F may be stripped together, so that the conducting layer 4 located on the photoresist F is removed. Certainly, in another embodiment, the gate 5 may further be formed by using another method. For example, the conducting layer may be directly deposited on the substrate 1. Next, the conducting layer other than the gate 5 is corroded by using the photoetching method. Next, the buffer layer 2 is then formed on the same lateral surface 11 around the conducting layer, so that the objective may also be achieved. Any method can be used, provided that by means of the method, the buffer layer 2 can be formed on the same lateral surface 11 around the gate 5. This is not uniquely limited herein.

Further, in an embodiment of this application, a method for stripping the photoresist F is: corroding the photoresist F by using a photoresist-removal liquid. When the photoresist F is removed by using the photoresist-removal liquid, the conducting layer 4 deposited on the photoresist F is removed at the same time, which is very convenient and efficient. Certainly, in another embodiment, another method can be used, provided that by means of the method, the photoresist F and the conducting layer 4 deposited on the upper surface of the photoresist F can be removed. This is not uniquely limited herein.

Further, in an embodiment of this application, the buffer layer 2, the insulating layer 6, and the semiconductor layer 8 are formed by means of chemical vapor deposition. By means of chemical vapor deposition, it is relatively easy to form the buffer layer 2, the insulating layer 6, and the semiconductor layer 8, and costs are low. Certainly, in another embodiment, the buffer layer 2, the insulating layer 6, and the semiconductor layer 8 may be deposited in another manner. This is not uniquely limited herein.

Optionally, in an embodiment of this application, materials used in the buffer layer 2 and the insulating layer 6 include silicon nitride. In this way, insulation may be effectively achieved. Certainly, in another embodiment, the material may be another material, provided that insulation can be achieved and when a voltage is applied to or removed from the gate 5, a switch function of the gate 5 can be achieved.

Optionally, in an embodiment of this application, materials used in the gate 5 and the data line 71 include aluminum or molybdenum. Aluminum and molybdenum have relatively good electrical conductivity and are easy to be deposited, so that generation costs and production difficulty can be reduced. In another embodiment, the materials of the gate 5 and the data line 71 are not limited to aluminum or molybdenum, provided that the gate 5 and the data line 71 having good electrical conductivity can be formed. In addition, the gate 5 and the data line 71 are not limited to deposition of only one type of material. Instead, a plurality of types of materials or a plurality of layers of materials may be deposited. For example, in the gate 5, aluminum may be deposited first, and molybdenum is deposited next. In the data line 71, molybdenum may be deposited first, aluminum is deposited next, and finally molybdenum is deposited, provided that the gate 5 and the data line 71 are easily conductive. The deposition sequence is not uniquely limited herein.

An embodiment of this application further provides a gate structure (not shown), including: a substrate 1; a buffer layer 2, formed on same lateral surface 11 of the substrate 1, where a groove 3 penetrating the buffer layer 2 is disposed on the buffer layer 2; a gate 5, formed in the groove 3, where an upper surface 21 of the buffer layer 2 and an upper surface 51 of the gate 5 are located on a same plane P; an insulating layer 2, formed on the upper surface 21 of the buffer layer 2 and the upper surface 51 of the gate 5; a semiconductor layer 8, formed on an upper surface 61 of the insulating layer 6 and disposed opposite the gate 5; and a data line 71, intersecting with the gate 5, and formed on the upper surface 61 of the insulating layer 6 and/or an upper surface 83 of the semiconductor layer 8. The gate 5 is formed on the substrate 1, the buffer layer 2 is formed on the same lateral surface 11 around the gate 5, and the upper surface 21 of the buffer layer and the upper surface 51 of the gate are on the same plane P, so that the insulating layer 6 may be deposited on the plane P. Because the semiconductor layer 8 is deposited on the insulating layer 6 of the plane P, and the data line 71 is formed on the upper surface 61 of the insulating layer and the upper surface 83 of the semiconductor layer, the data line 71 is not affected by a shape and an outer profile angle of the gate 5. Therefore, in a conventional technology, the impact on the data line 71 by the shape and outer profile angle of the gate 5 is eliminated. In particular, an intersection 73 between the data line 71 and the gate 5 is prevented from fracturing. Certainly, a bridge part 74 between a source 72 and the gate 5 is prevented from easily fracturing.

An embodiment of this application further provides a display device (not shown). The display device includes a gate structure. A gate 5 is formed on a substrate 1, a buffer layer 2 is formed on same lateral surface 11 around the gate 5, and an upper surface 21 of the buffer layer and an upper surface 51 of the gate are on a same plane P, so that an insulating layer 6 may be deposited on the plane P. Because a semiconductor layer 8 is deposited on the insulating layer 6 of the plane P, and the data line 71 is formed on an upper surface 61 of the insulating layer and an upper surface 83 of the semiconductor layer, the data line 71 is not affected by a shape and an outer profile angle of the gate 5. Therefore, in a conventional technology, the impact on the data line 71 by the shape and the outer profile angle of the gate 5 is eliminated. In particular, an intersection 73 between the data line 71 and the gate 5 is prevented from fracturing. Certainly, a bridge part 74 between a source 72 and the gate 5 is prevented from easily fracturing. The display device further includes a plurality of pixels (not shown). The gate structure is electrically connected to a plurality of pixels. The display device may be a liquid crystal display. The gate structure and a plurality of pixel electrodes are disposed inside the liquid crystal display. The gate structure is electrically connected to the plurality of pixel electrodes. Certainly, in another embodiment, the display device may further be another display device. This is not uniquely limited herein.

The foregoing embodiments are merely specific implementations of this application, but are not intended to limit the protection scope of this application. Any modification, replacement, and improvement readily figured out by a person skilled in the art within the technical scope disclosed in this application shall fall within the protection scope of this application. Therefore, the protection scope of this application shall be subject to the protection scope of the claims.

What is claimed is:

1. A method for manufacturing a gate structure, comprising the following steps:
   providing a substrate, and forming a buffer layer on a lateral surface of the substrate;
   forming a groove on the buffer layer, wherein the groove penetrates the buffer layer;
   forming a gate in the groove, wherein an upper surface of the gate and an upper surface of the buffer layer are located on a same plane;
   forming an insulating layer on the upper surface of the gate and the upper surface of the buffer layer;
   forming, on an upper surface of the insulating layer, a semiconductor layer disposed opposite the gate; and
   forming, on an upper surface of the semiconductor layer and/or the upper surface of the insulating layer, a data line partially overlapping the semiconductor layer,
   wherein the groove is formed by means of a photoetching process,
   wherein steps of the photoetching comprise:
   coating a photoresist on the upper surface of the buffer layer;
   disposing a light source over the photoresist;
   turning on the light source, wherein the light source emits a light ray to expose a part of the photoresist;
   developing the exposed photoresist;
   corroding the exposed photoresist, and corroding the buffer layer located between the exposed photoresist and the substrate; and
   cleaning the substrate, and eliminating the photoresist and the buffer layer.

2. The method for manufacturing a gate structure according to claim 1, further comprising the following steps:
   forming a conducting layer of the gate on upper surfaces of the photoresist and the groove by means of deposition; and
   stripping the photoresist.

3. The method for manufacturing a gate structure according to claim 2, wherein a method for stripping the photoresist is:
   corroding the photoresist by using a photoresist-removal liquid.

4. The method for manufacturing a gate structure according to claim 1, wherein the buffer layer, the insulating layer, and the semiconductor layer are formed by means of a chemical vapor deposition process.

5. The method for manufacturing a gate structure according to claim 1, wherein materials used in the buffer layer and the insulating layer comprise silicon nitride.

6. The method for manufacturing a gate structure according to claim 1, wherein materials used in the gate and the data line comprise aluminum or molybdenum.

7. A gate structure, comprising:
   a substrate;

a buffer layer, formed on a lateral surface of the substrate, wherein a groove penetrating the buffer layer is disposed on the buffer layer;

a gate, formed in the groove, wherein an upper surface of the buffer layer and an upper surface of the gate are located on a same plane;

an insulating layer, formed on the upper surface of the buffer layer and the upper surface of the gate;

a semiconductor layer, formed on an upper surface of the insulating layer and disposed opposite the gate; and a data line, formed on the upper surface of the insulating layer and/or an upper surface of the semiconductor layer, and partially overlapping the semiconductor layer, wherein a conducting layer of the gate is formed on upper surfaces of a photoresist and the groove by means of deposition.

8. The gate structure according to claim 7, wherein the groove is formed by means of a photoetching process.

9. The gate structure according to claim 7, wherein the buffer layer, the insulating layer, and the semiconductor layer are formed by means of a chemical vapor deposition process.

10. The gate structure according to claim 7, wherein materials used in the buffer layer and the insulating layer comprise silicon nitride.

11. The gate structure according to claim 7, wherein materials used in the gate and the data line comprise aluminum.

12. The gate structure according to claim 7, wherein materials used in the gate and the data line comprise molybdenum.

13. A gate structure, comprising:

a substrate;

a buffer layer, formed on a lateral surface of the substrate, wherein a groove penetrating the buffer layer is disposed on the buffer layer;

a gate, formed in the groove, wherein an upper surface of the buffer layer and an upper surface of the gate are located on a same plane;

an insulating layer, formed on the upper surface of the buffer layer and the upper surface of the gate;

a semiconductor layer, formed on an upper surface of the insulating layer and disposed opposite the gate; and a data line, formed on the upper surface of the insulating layer and/or an upper surface of the semiconductor layer, and partially overlapping the semiconductor layer, wherein the groove is formed by means of a photoetching process; a conducting layer of the gate is forming on upper surfaces of a photoresist and the groove by means of deposition; and the buffer layer, the insulating layer, and the semiconductor layer are formed by means of a chemical vapor deposition process.

\* \* \* \* \*